(12) United States Patent
Wuori et al.

(10) Patent No.: US 10,170,171 B2
(45) Date of Patent: Jan. 1, 2019

(54) 3D SPINRAM

(71) Applicant: Integrated Magnetoelectronics Corp., Berkeley, CA (US)

(72) Inventors: Edward Wuori, Saint Paul, MN (US); Richard Spitzer, Berkeley, CA (US)

(73) Assignee: Integrated Magnetoelectronics Corporation, Berkeley, CA (US)

( * ) Notice: Subject to any disclaimer, the term of this patent is extended or adjusted under 35 U.S.C. 154(b) by 0 days.

(21) Appl. No.: 15/835,217

(22) Filed: Dec. 7, 2017

(65) Prior Publication Data

US 2018/0166113 A1    Jun. 14, 2018

Related U.S. Application Data (60) Provisional application No. 62/432,421, filed on Dec. 9, 2016.

(51) Int. Cl.
| | |
|---|---|
| *G11C 5/06* | (2006.01) |
| *G11C 11/16* | (2006.01) |
| *G11B 5/39* | (2006.01) |
| *H01F 10/32* | (2006.01) |
| *H01L 43/02* | (2006.01) |
| *H01L 43/08* | (2006.01) |
| *H01L 43/12* | (2006.01) |

(52) U.S. Cl.
CPC .......... *G11C 11/161* (2013.01); *G11B 5/3903* (2013.01); *G11C 11/1697* (2013.01); *H01F 10/3281* (2013.01); *H01L 43/02* (2013.01); *H01L 43/08* (2013.01); *H01L 43/12* (2013.01); *G11B 2005/3996* (2013.01)

(58) Field of Classification Search
CPC .............. G11C 11/161; G11C 11/1697; G11B 2005/3996; G11B 5/3903; H01L 43/08; H01L 43/02; H01L 43/12; H01F 10/3281
USPC .......................... 365/158, 148, 100, 163, 63
See application file for complete search history.

(56) References Cited

U.S. PATENT DOCUMENTS

| | | | |
|---|---|---|---|
| 5,237,529 | A | 8/1993 | Spitzer |
| 5,491,338 | A | 2/1996 | Spitzer |
| 5,587,943 | A | 12/1996 | Torok et al. |
| 5,592,413 | A | 1/1997 | Spitzer |
| 5,929,636 | A | 7/1999 | Spitzer et al. |
| 6,031,273 | A | 2/2000 | Torok et al. |
| 6,469,927 | B2 | 10/2002 | Spitzer et al. |
| 6,483,740 | B1 | 11/2002 | Spitzer et al. |
| 6,538,437 | B2 | 3/2003 | Spitzer et al. |
| 6,573,713 | B2 | 6/2003 | Spitzer et al. |
| 6,594,175 | B2 | 7/2003 | Torok et al. |
| 6,738,284 | B2 | 5/2004 | Torok et al. |
| 6,859,063 | B2 | 2/2005 | Nuspl et al. |
| 6,992,919 | B2 | 1/2006 | Andrei et al. |
| 7,005,852 | B2 | 2/2006 | Andrei et al. |
| 7,220,968 | B2 | 5/2007 | Burger et al. |
| 7,224,566 | B2 | 5/2007 | Barna et al. |

(Continued)

OTHER PUBLICATIONS

U.S. Appl. No. 15/833,424, filed Dec. 6, 2017, Wuori.

(Continued)

*Primary Examiner* — Gene Auduong (74) *Attorney, Agent, or Firm* — Weaver Austin Villeneuve & Sampson LLP (57) ABSTRACT

Techniques are described that enable a high-capacity memory chip based on three-dimensional SpinRAM cells and modules, and support electronics, at least some of which, are implemented with all-metal solid-state components.

16 Claims, 6 Drawing Sheets

(56) References Cited

U.S. PATENT DOCUMENTS

| | | |
|---|---|---|
| 7,767,386 B2 | 8/2010 | Dunn |
| 7,911,830 B2 | 3/2011 | Torok et al. |
| 8,300,455 B2 | 10/2012 | Torok et al. |
| 8,619,467 B2 | 12/2013 | Torok et al. |
| 9,741,923 B2 | 8/2017 | Torok et al. |
| 2002/0037595 A1 | 3/2002 | Hosotani |
| 2005/0083743 A1 | 4/2005 | Andrei et al. |
| 2005/0269612 A1 | 12/2005 | Torok et al. |
| 2013/0147045 A1 | 6/2013 | Grossi et al. |
| 2013/0208535 A1 | 8/2013 | Kwon et al. |
| 2018/0166097 A1 | 6/2018 | Wuori |

OTHER PUBLICATIONS

PCT International Search Report and Written Opinion, dated Mar. 15, 2018, issued in PCT/US2017/065165.
PCT International Search Report and Written Opinion, dated Aug. 30, 2018, issued in PCT/US2017/064864.

3D SPINRAM

RELATED APPLICATION DATA

The present application is a nonprovisional and claims priority under 35 U.S.C. 119(e) to U.S. Provisional Patent Application No. 62/432,421 entitled Integrated Magneto-Electronics (IME) 3D SpinRAM filed on Dec. 9, 2016, the entire disclosure of which is incorporated herein by reference for all purposes.

BACKGROUND

The development of all-metal (i.e., metals and insulators but no semiconductors) memory known as SpinRAM by Integrated MagnetoElectronics (IME) has addressed three basic challenges at the memory-cell level: (1) scalability (decreasing drive currents and stable error rates with decreasing feature size); (2) high endurance (number of read/write cycles before cell breakdown); and (3) thermal stability of stored information (stability against errors due to thermally-induced transitions between two states that represent different bit values; an effect that increases with decreasing element volume and comes into play at deep nanoscale feature sizes).

Three interrelated features were developed by IME to enable scalability, increased endurance, and thermal stability in a memory array based on SpinRAM memory cells: (1) a closed-flux cell structure; (2) parallel drive lines at the memory cell; and (3) increased film thickness, respectively. These are three of the design features that distinguish SpinRAM cells from other magnetic-RAM designs. Endurance was incorporated in the early SpinRAM cells fabricated. A higher degree of scalability is enabled in the latest SpinRAM design by the fully-closed-flux structure of the memory cells and correspondingly lower drive fields. The issue of thermal stability has been resolved conceptually.

IME has also identified two basic issues beyond the cell level: (1) compatibility of fabrication technology with CMOS processing; at this time, already demonstrated by commercial magnetic RAM; and (2) high capacity. IME separated the development of scalability from that of capacity, as the issues attendant to the two are distinct. IME is pursuing independent programs in parallel to address each issue, with the intent of combining the results at a later development stage.

An important issue relating to magnetic-RAM scalability is control of the demagnetizing field $H_d$, the field produced by the magnetization M itself.

IME has chosen giant magnetoresistive (GMR) films for memory cell design, despite the smaller signal of some GMR structures relative to that of tunnel magnetoresistance (TMR) structures, for reasons discussed in U.S. Pat. No. 9,741,923 entitled SpinRAM issued on Aug. 22, 2017, the entire disclosure of which is incorporated herein by reference for all purposes.

To realize high capacity, IME implemented two additional development programs. One program involves enhancing GMR by developing a ferromagnetically-coupled GMR superlattice with low drive fields and significantly higher GMR values than previously available, as described in U.S. Pat. No. 8,619,467 entitled High GMR Structure With Low Drive Fields issued on Dec. 31, 2013, the entire disclosure of which is incorporated herein by reference for all purposes. Such structures increase the signal strength of the memory cell. The other program involves development of a three-dimensional structure referred to as 3D SpinRAM.

Figure 1:
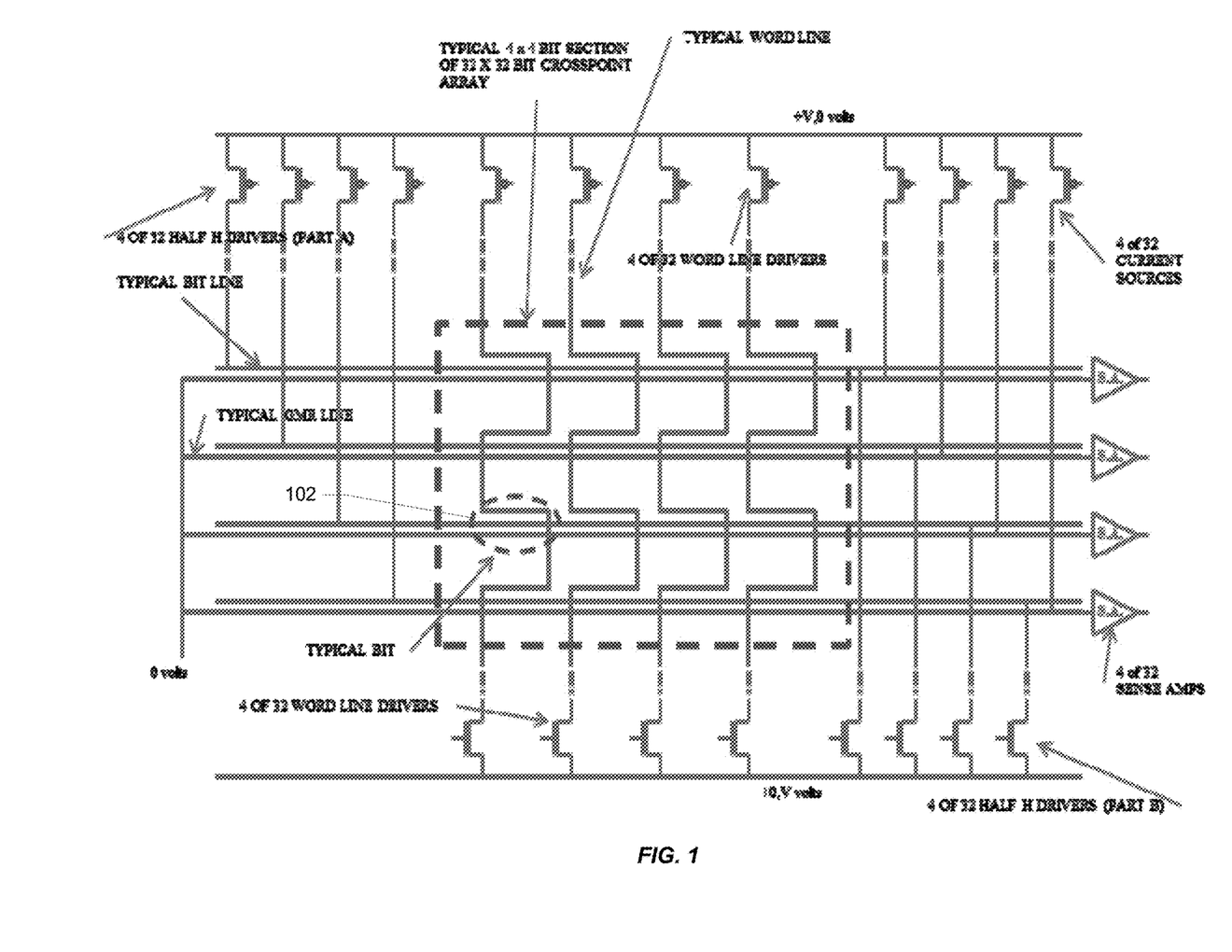
FIG. 1 is a simplified diagram of a coincident-current memory architecture.

The functional memory components of SpinRAM—the memory array without support electronics—is made of metal and insulators (no semiconductors), with the potential for monolithic 3D structures (vertically replicated 2D arrays); the storage density per unit area of such a 3D SpinRAM can exceed that of a hard disk; for many mainstream applications, e.g., ones that depend on a specific number of input/output operations per second, it should also cost less than hard disk. To date, SpinRAM has been implemented as a coincident-current architecture of the kind illustrated in FIG. 1 and described, for example, in U.S. Pat. No. 9,741,923, incorporated herein by reference above. In such an architecture, the storage cell is located in the portion of the overlap of the GMR line with the parallel portions of the drive lines, and co-linearity of the drive lines at a given memory cell (as represented by oval 102) ensures that the drive fields at the cell location are co-linear.

SUMMARY

According to a particular class of implementations, a three-dimensional memory, includes a first level including first circuitry configured to generate drive signals for each of a plurality of memory cells in the memory. The first circuitry is also configured to generate address signals corresponding to each of the memory cells. The address signals address the memory cells as a two-dimensional array. The memory includes a plurality of memory array levels fabricated in a stack on the first level. Each memory array level includes a corresponding memory cell array including a subset of the memory cells. Each memory cell includes a multilayer structure exhibiting magnetoresistance. Each memory array level also includes second circuitry configured to translate corresponding address signals from the first circuitry to a physical structure of the corresponding memory cell array, and to route corresponding drive signals to corresponding memory cells. The second circuitry is implemented using solid-state components. Each solid state component includes a network of multilayer structures exhibiting magnetoresistance.

According to some implementations, the first circuitry of the first level is implemented using solid-state components, each of which includes a network of multilayer structures exhibiting magnetoresistance.

According to some implementations, each solid state component is configured to generate an output signal which is a function of a resistive imbalance among the multilayer structures and which is proportional to a power current in the network of multilayer structures.

According to some implementations, the first circuitry of the first level is implemented using CMOS circuitry, and the memory includes translation circuitry configured to translate logic levels between the first circuitry of the first level and the second circuitry of the memory array levels. According to a subset of these implementations, a first memory array level is directly adjacent the first level, and the first circuitry includes a plurality of memory cell drivers implemented using CMOS circuitry and configured for driving the memory cells of the first memory array level.

According to some implementations, each memory cell has a fully-closed flux structure.

According to some implementations, the address signals generated by the first circuitry address the memory cells of the three-dimensional memory as a two-dimensional array of size $2^n$, where n is an even integer.

According to some implementations, the memory cell array of each of the memory array levels includes $2^p$ of the memory cells, where p is an even integer.

According to some implementations, the memory cell array of each of the memory array levels includes $2^m$ memory cell modules, where m is an even integer. Each of the memory cell modules includes a corresponding portion of the subset of the memory cells of the memory cell array in which the memory cell module is included.

According to some implementations, a size of the first circuitry is substantially independent of a size of the second circuitry.

According to some implementations, a configuration of the first logic is independent of a number of the memory array levels. According to some of these implementations, each of the memory array levels includes a plurality of memory cell modules. Each of the memory cell modules includes a corresponding portion of the subset of the memory cells of the memory array level in which the memory cell module is included. The configuration of the first logic is independent of a number of memory cell modules in each of the memory array levels.

According to some implementations, the first circuitry is configured to interface with an external addressing scheme that employs a row address strobe/column address strobe access scheme.

According to some implementations, the first circuitry is configured to interface with an external addressing scheme that employs a linear chain of numbers access scheme.

According to some implementations, the second circuitry for each memory array level is configured to apply the drive signals to the corresponding memory cells using a coincident-current architecture.

According to some implementations, the memory cells of the memory array levels and the second circuitry were fabricated with a single pumpdown.

A further understanding of the nature and advantages of various implementations may be realized by reference to the remaining portions of the specification and the drawings.

DETAILED DESCRIPTION

Reference will now be made in detail to specific implementations. Examples of these implementations are illustrated in the accompanying drawings. It should be noted that these examples are described for illustrative purposes and are not intended to limit the scope of this disclosure. Rather, alternatives, modifications, and equivalents of the described implementations are included within the scope of this disclosure as defined by the appended claims. In addition, specific details may be provided in order to promote a thorough understanding of the described implementations. Some implementations within the scope of this disclosure may be practiced without some or all of these details. Further, well known features may not have been described in detail for the sake of clarity.

Techniques are described herein that enable a high-capacity memory chip. According to various implementations, such a memory chip is enabled by a three-dimensional (3D) SpinRAM module and support electronics based on an all-metal solid-state component developed by IME called the "transpinnor," implementations of which are described in U.S. Pat. No. 5,929,636 entitled All-Metal Giant Magnetoresistive Solid-State Component issued Jul. 27, 1999, the entire disclosure of which is incorporated herein by reference for all purposes. Examples of overall SpinRAM architectures, their operation, the structures of GMR films used in the cell, and cell designs suitable for use in 3D architectures enabled by this disclosure are described in patents incorporated herein by reference above.

The fact that a SpinRAM cell has no semiconductors obviates a major obstacle in the fabrication of 3D semiconductor circuits. It allows SpinRAM structures to be stacked vertically and electrically connected, as needed, by interconnecting layers. The vertical disposition of SpinRAM structures modifies the physical deployment of the system building blocks without affecting the logical and electronic functionality of the system.

Vertical manufacturing technology enables building nonvolatile memory structures with the required all-metal support electronics—sense amplifiers, decode circuitry, bit and word drivers, data buffers—physically deployed above, beneath, or alongside the memory cell array. This has the potential for significantly reducing the overall physical area of the memory component, while greatly increasing the active area.

Vertical manufacturing capability creates the potential for 3D SpinRAM to exceed the memory density per unit area of mechanical-magnetic storage (HDD). In addition, SpinRAM consumes little power because only accessed lines and associated support electronics are powered so that, unlike hard-disk storage, power in data centers remains substantially constant with increasing capacity.

Furthermore, 3D structures as described herein may significantly reduce the cost of electronic components as the cost of an IC is more nearly proportional to its area than to its volume.

Figure 2:
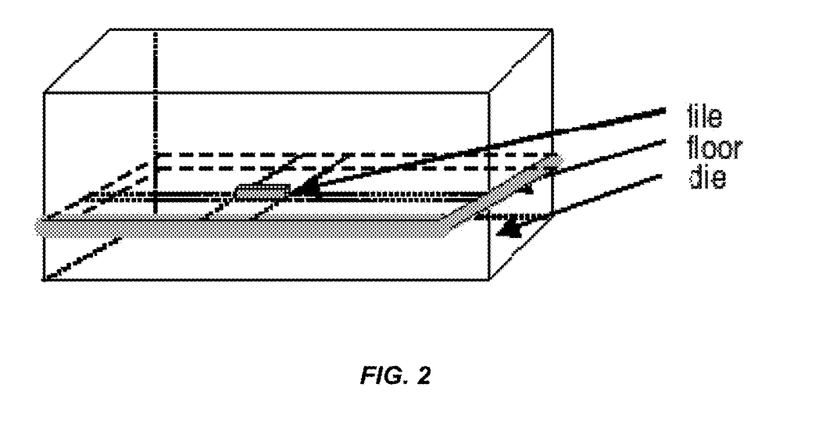
FIG. 2 is a simplified representation of a portion of the structure of a 3D memory architecture.

At the physical level, some implementations enabled by the present disclosure contemplate a highly modular 3D construction. The basic module, called a "tile," is a self-contained memory module, i.e., cell array and ancillary circuitry. Multiple tiles are physically organized into a 2D construction, called a "floor." Multiple floors are stacked to form a 3D "die." A simplified diagram of such a structure is shown in FIG. 2.

According to a particular class of implementations, the tile itself has a multi-part structure: 1) the cell array; 2) connection to support electronics (address logic, sense amplifiers) at the periphery; and 3) connection stratum (for intra-die connectivity). One advantage associated with tiles organized in such a structure is that the overhead and connections do not increase the overall footprint of the structure appreciably.

Figure 3:
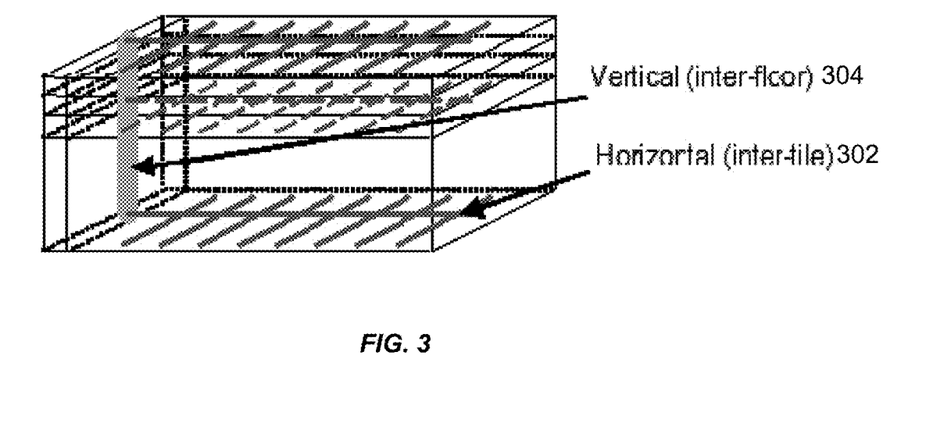
FIG. 3 is a simplified representation of a portion of the structure of a 3D memory architecture.

A simplified representation of intra-chip interconnectivity is shown in FIG. 3. Such a 3D architecture differs fundamentally from the packaging of multiple wafers in a single module. In the depicted implementation, intra-tile and inter-tile (horizontal) connectivity is achieved via a dedicated connection stratum (e.g., 302); inter-floor (vertical) connectivity is achieved via a dedicated area 304 at the floor edges, which increases floor area slightly. Tiles are connected to an internal bus. It should be noted that this is one illustrative example of inter-floor connectivity; other arrangements are contemplated.

Additional details of some 3D implementations are described in U.S. Pat. No. 6,992,919 entitled All-Metal Three-Dimensional Circuits and Memories issued on Jan. 31, 2006, the entire disclosure of which is incorporated herein by reference for all purposes.

According to implementations employing the modular architecture, the support circuitry of the 3D SpinRAM provides the drive currents and the logic to find the floor, the tile in the floor, and the location of the cell in the tile. One approach is to use CMOS for all the support electronics, placing the support electronics underneath the 3D memory-cell structure. However, a preliminary design of the CMOS electronics for one floor of the SpinRAM cells was estimated to be roughly equal to that of the SpinRAM floor. That meant that as the logic changed (e.g., adding a floor, adding tiles to a floor, or increasing tile capacity), the CMOS electronics would have to be duplicated on a separate level for each change to avoid enlarging the area of the array. Although some progress has been made in the fabrication of 3D CMOS structure, a particular class of implementations enabled by the present disclosure has taken a different approach.

According to such implementations, the support electronics is divided into two parts: a first part that logically addresses the specific cell to which drive currents are to be delivered (referred to herein as "the first logic"), and a second part that translates the logical addressing scheme used by the first logic into the physical structure of the 3D memory, providing the logic to find the floor and the tile that contain the addressed cell (referred to herein as "the second logic"). According to some implementations, the first logic is implemented in CMOS and the second logic is implemented with transpinnors. In such implementations, the transpinnor part lies between the CMOS and the memory cells. In other implementations, both the first logic and the second logic are implemented with transpinnor-based circuitry. In all such implementations, transpinnor-based circuitry may be fabricated together with the memory cells in one pumpdown.

"Pumpdown" refers to the way that a vacuum chamber is brought to a state of high vacuum (very low pressure) during fabrication. If such a chamber is opened and allowed to be at full ambient atmospheric pressure for any length of time, atomic monolayers of atmospheric gases (especially water vapor) form on the internal chamber surfaces. These impurities are difficult to remove. For implementations that employ CMOS support electronics, these contaminating monolayers may be removed by "back-sputtering," a process by which the silicon wafer is lightly sputtered for purposes of cleaning. However, not only are the layers from which GMR films are constructed highly sensitive to impurities, they are so thin (only a few atomic layers thick) that they cannot tolerate the back-sputtering cleaning step. So to prevent contamination of the GMR films, they are preferably formed "in one pumpdown." In some cases, these fabrication steps may be grouped with other fabrication steps.

Referring back to the division of the support electronics, the configuration of the tiles and floors is effectively transparent to the first logic. That is, from the perspective of the first logic, the 3D memory is contiguously connected in an address space of size equal to at least the total size of the 3D memory. In other words, the first logic addresses a conceptual single flat (e.g., 2D) array whose capacity is equal to at least the total number of cells in the 3D memory. For implementations in which this capacity is chosen to be an even power of 2, it can be represented in the binary form $2^n$ (where n is an even integer). Two parameters are used to specify the cell: the number of the word line and the number of the bit line in the (conceptually) flat array. As the size of the 3D physical memory is increased by the addition of tiles in a floor, number of floors, or number of cells in a tile, only the range of numerical values of these two parameters representing the conceptual 2D memory needs to be changed, i.e., only the number of word lines and the number of bit lines, e.g., the numerical value of n/2, changes. However, the number of data and control lines in the first logic does not increase with 3D memory capacity. In some implementations and for historical reasons, the size of the physical 2D memory of each floor may be an even power of 2, in which case it can also be represented in the binary form $2^p$ (where p is an even integer). But there is little history on the structure of 3D memories, and the typical number of floors q may turn out not to be an even power of 2, e.g., there might be an odd number of floors. In such cases the total size s of the physical 3D memory (die), $s=q2^p$, would not be an even power of 2. Therefore, if the capacity of the conceptual 2D memory array is chosen to be an even power of two, it must be chosen to be larger than that of the physical memory, i.e., $2^n>s$. On the other hand, if the number of floors is an even power of 2, $q=2^r$ (where r is an even integer), then the total size of the physical 3D memory is an even power of 2, $s=2^{p+r}$, and the size of the conceptual 2D memory can be chosen to be equal to that of the 3D physical memory, i.e. n=p+r. In either case, the size of the first logic remains substantially the same as the sizes of the 3D physical memory and of the 2D conceptual memory increase, i.e., the first logic is substantially independent of the size of the 3D memory. The first logic can therefore be implemented in a single layer that can be conveniently positioned underneath the 3D memory-cell structure.

The second logic translates the addressing scheme used by the first logic into the physical addressing scheme for the floor, the tile in the floor, and the word line and bit line of the tile. One advantage is that if additional levels of transpinnor logic are needed as the size of the memory is increased, they can all be fabricated together with the memory cells in one pumpdown.

For implementations in which the first logic is implemented in CMOS and the second logic is transpinnor-based, the output of the CMOS logic has different characteristics than the transpinnor-based GMR logic receiving the signals. Likewise, the GMR logic sending signals to the CMOS logic faces a mismatch in characteristics. For example, CMOS logic levels are typically voltage based, and GMR logic levels are typically current based.

To address this, translation circuitry is provided to effect translation of signals in both directions and handle these logic-characteristic mismatches. The CMOS-to-GMR translator can be implemented in CMOS (and placed on the silicon) or it can be implemented in transpinnor logic (and placed on the appropriate floor). Likewise, the GMR-to-CMOS translator can be implemented in CMOS (and placed on the silicon) or it can be implemented in GMR logic (and placed on the appropriate floor). Placement of the translators can sometimes be context sensitive, requiring them to be placed specifically in silicon or in transpinnor-based circuitry, depending on the situation. For such implementations, each driver and each receiver requires a translator.

Examples of translator designs that enable transpinnor logic levels to be easily adapted to one another and to CMOS levels are described in U.S. Pat. No. 7,224,566 entitled Interfaces Between Semiconductor Circuitry and Transpinnor-Based Circuitry issued on May 29, 2007, the entire disclosure of which is incorporated herein by reference for all purposes. Such translators allow seamless connection of logic in and among CMOS and transpinnor circuits. For CMOS-to-transpinnor interfacing it is important to provide proper resistive loads to convert the CMOS voltages to transpinnor input currents. Transpinnor-to-CMOS interfacing involves level shifting and/or amplification on the CMOS side.

An example of a particular implementation of a 3D SpinRAM architecture, showing the floors containing the memory cells, the CMOS logic (i.e., the first logic), the transpinnor-based logic (i.e., the second logic), and the CMOS-transpinnor interface (represented by the various drivers and receivers) is illustrated in the diagrams of FIGS. 4-7. It should again be noted that architectures are contemplated in which the first logic is implemented using transpinnor-based circuitry.

In the depicted implementation, the 3D memory is built on a silicon wafer. Shown in these four figures is a SpinRAM multi-floor stack in which each tile is a 32×32 element array. Maximum tile size is basically set by the requirement that the signal on the sense line be a sufficiently large multiple of the noise. For present values of GMR, 32 bits/line provides a comfortable margin. As values of GMR increase, tile size can increase correspondingly. The number of tiles on a floor is basically dictated by chip size. The lateral dimension of a typical memory chip is currently about 0.5 cm. The lateral dimension of a 32×32 tile for a $4F^2$ cell size is 64F (where F represents feature size). For F=100 nm, a floor on the chip has room for about $8^2 \times 10^4$ tiles; about 80 Mbytes. If roughly half that space is assumed to be taken up by ancillary functions, a chip with 10 floors would contain a 400-Mbyte memory at 100 nm feature size, and a 10-Gbyte memory at 20 nm feature size.

Returning to FIGS. 4-7, if there were only one floor, the drivers could be built directly into CMOS (FIG. 4) below the GMR memory array on Floor 1 (FIG. 5), and no GMR-based drivers would be necessary. The floor depicted in FIG. 5 assumes that the needed drivers are built into the silicon of FIG. 4 using CMOS technology. The CMOS-based drivers depicted in FIG. 4 outlines roughly where these CMOS drivers may be located. These drivers are estimated to take up about as much area as the GMR memory array, and thus placing them directly below the Floor 1 memory elements works well. Some space in the CMOS floor is allocated for address lines presumed to enter from an edge of the chip. This is identified in FIG. 4 as "Space for address line routing." The address or portions of the address are passed vertically to the other floors as well. The four corners identified in FIGS. 4, 5 and 6 as "Floor decoder/drivers" or "Floor decoder/receivers" are allocated for this purpose where common address information is passed to all the floors and distributed as appropriate. Each Driver and each Receiver represents a translator as discussed above.

Figure 4:
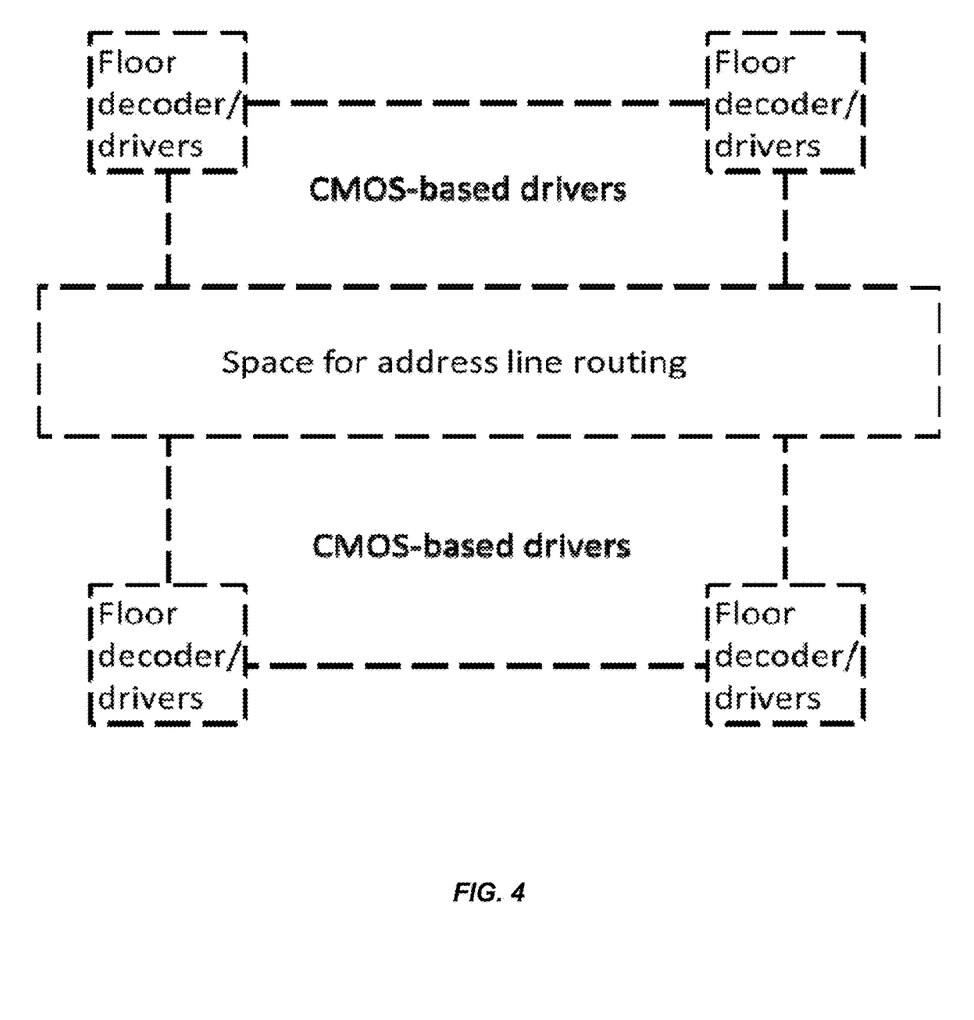
FIG. 4 is a simplified representation of a floor in a multi-floor 3D memory that includes CMOS logic and drivers.
Figure 5:
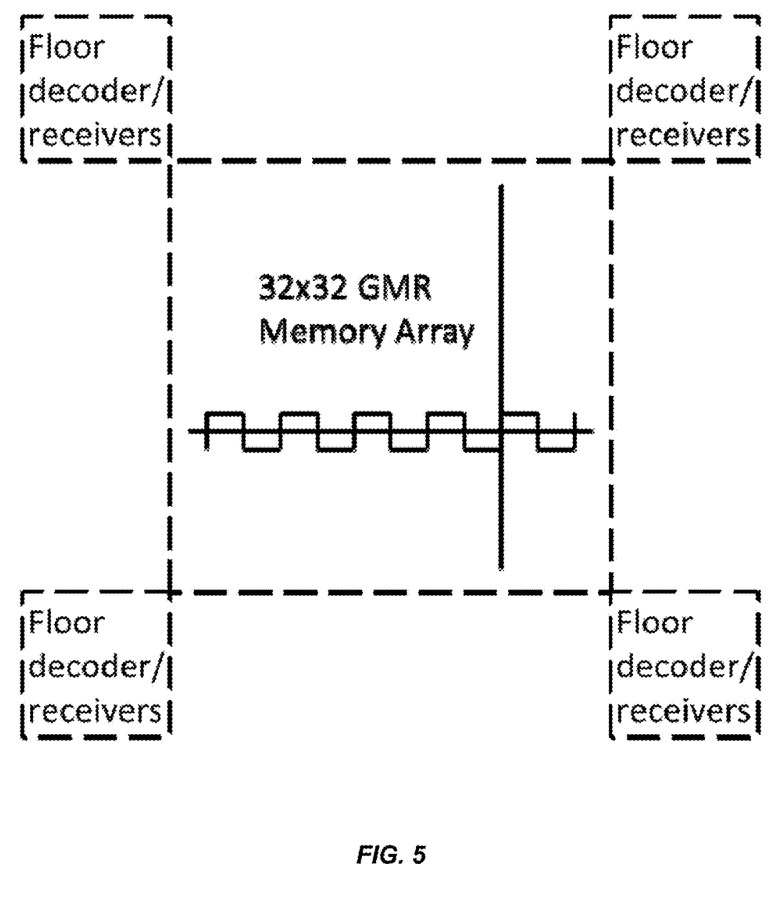
FIG. 5 is a simplified representation of a floor in a multi-floor 3D memory that includes GMR memory elements.
Figure 6:
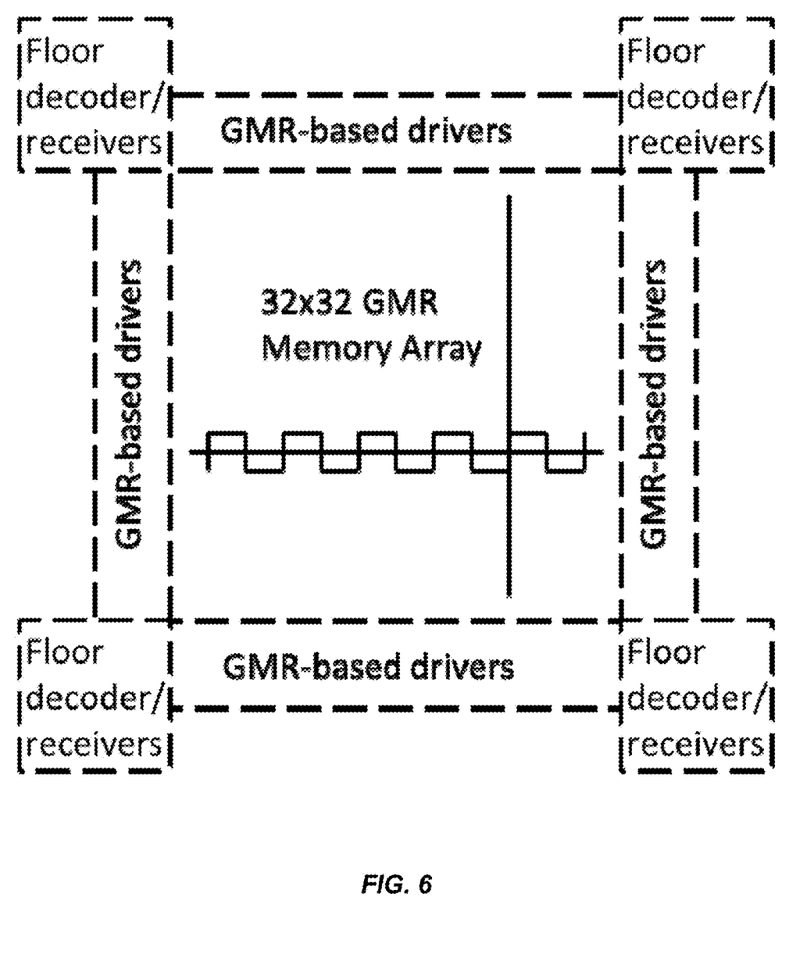
FIG. 6 is another simplified representation of a floor in a multi-floor 3D memory that includes GMR memory elements and GMR-based drivers.

It should be noted that floor 1 as depicted in FIG. 5 can be different than the other floors in that its drivers can be located on the silicon of FIG. 4 and implemented in CMOS if desired. FIGS. 4 and 5 depict an implementation in which this method is used. However, Floor 1 may be implemented exactly the same as the other floors (e.g., as shown in FIG. 6). Were this done, and the CMOS layer used for some other purpose, then only the addressing information would be passed up from the silicon level and distributed to the GMR array.

The difference between the floor depicted in FIG. 6 and the floor depicted in FIG. 5 is that FIG. 6 represents the memory floors above floor 1 and so includes GMR-based logic and drivers. Floor 1 in FIG. 5 does not. However, implementations are contemplated in which floor 1 is constructed similarly to the floors above it.

Implementation of the first logic in CMOS is useful for applications in which the values of GMR are not large enough to provide comfortable margins for the drive currents. Values of GMR as low as 5% are sufficient for some applications, but substantially higher values of GMR are required for other applications. Thus, for some implementations, the first logic delivers the currents as well as address values representing selected word and digit lines. The overall size of the conceptual memory is represented by n/2, the number of word and digit lines in a two-dimensional array.

Another point relates to the information provided by an external read/write command (not shown) to first logic. If the external command uses a RAS (Row Address Strobe), CAS (Column Address Strobe) accessing scheme, then the first logic is provided directly with values representing the selected word and digit lines. If, alternatively, the external command provides a single number in a linear chain of $2^n$ numbers, the first logic translates this single number into the two numbers representing the selected word and digit lines. Alternatively, this algorithm can be implemented by the decoders on all the memory floors. The algorithm for this translation is independent of the memory size. In the case where the memory size is an even power of 2 and represented in binary format, simply divide the exponent in $2^n$ by 2. As the size of the memory changes, the numerical range of values for n changes, but the logic for generating the address values does not. Independently of the form of the address provided to first logic, first logic is therefore independent of n, and therefore of the size of the memory.

The first logic sends the address values representing the selected word and digit lines to every memory floor substantially simultaneously. The logic on each floor determines whether the given address values fit the addresses on that floor. An address decoder on a given floor accepts or rejects the address onto the floor. If the floor accepts the address and currents, then data are multiplexed to or from an I/O bus. The correct tile on the floor that has accepted the address then accepts or rejects the tile address on that floor by logic and a decoder similar to the logic that accepted the values for the floor, but with size of memory replaced by size of the floor $2^p$, i.e., n in the exponent replaced by suitable even integer p determined by the size of the floor array. We make use of the fact that floor size can also be expressed in binary form. The address of the cell in the selected tile is determined by tile logic (e.g., see FIG. 1).

There can be some variation in the second logic depending on the physical scheme used to implement the 3D memory structure. The figures describe two different schemes in which CMOS is used to implement the first logic in bottom floor, and transpinnor logic is used to implement the second logic on the upper floors. In the approach shown in FIGS. 2 and 3, the first logic provides the address values to each of the memory floors (including the first floor) so that the GMR-based logic on each floor can determine whether the address values belong to that floor. In the approach shown in FIGS. 4 through 7, first floor may contain memory, and the first logic may be configured to provide the address values directly to the memory array of the first floor without requiring logic on the first floor to determine whether the address values belong to that floor.

Figure 7:
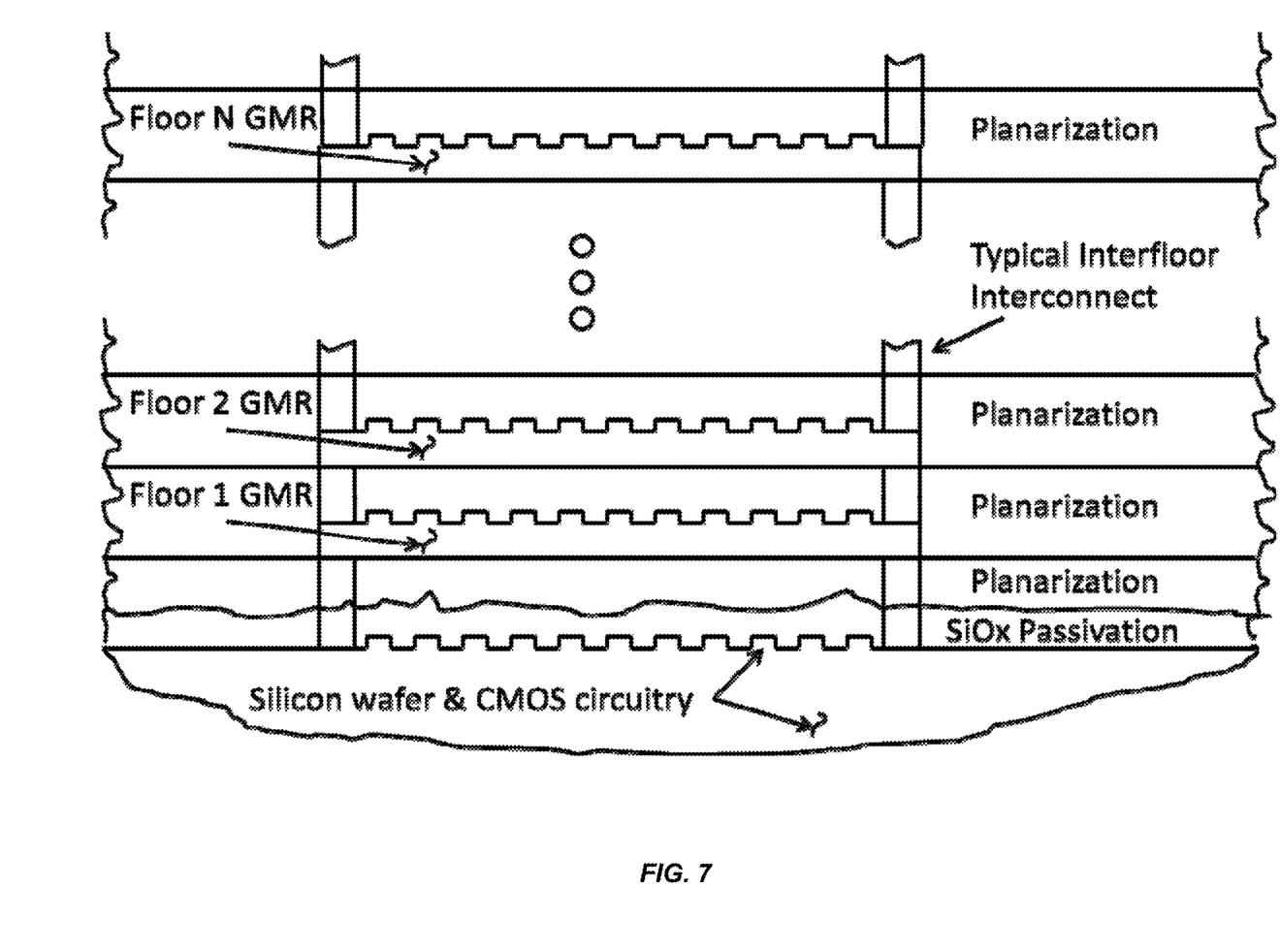
FIG. 7 is a simplified representation of a portion of a cross-section of a 3D memory.

FIG. 7 illustrates the layer build-up of the 3D stack in cross-section. It starts with the silicon wafer, shows surface roughness caused by the CMOS processing, a passivation layer (SiOx), and a planarization layer. Planarization layers are included in several places in the layer buildup to mitigate the effects of excessive processing roughness. As each floor of the GMR memory is added, it is planarized for the next floor. Interconnects are added through the planarization layers.

It will be understood by those skilled in the art that changes in the form and details of the implementations described herein may be made without departing from the scope of this disclosure. In addition, although various advantages, aspects, and objects have been described with reference to various implementations, the scope of this disclosure should not be limited by reference to such advantages, aspects, and objects. Rather, the scope of this disclosure should be determined with reference to the appended claims.

What is claimed is:

1. A three-dimensional memory, comprising:
a first level including first circuitry configured to generate drive signals for each of a plurality of memory cells in the memory, the first circuitry also being configured to generate address signals corresponding to each of the memory cells, the address signals addressing the memory cells as a two-dimensional array; and
a plurality of memory array levels fabricated in a stack on the first level, each memory array level including a corresponding memory cell array including a subset of the memory cells, each memory cell comprising a multilayer structure exhibiting magnetoresistance, each memory array level also including second circuitry configured to translate corresponding address signals from the first circuitry to a physical structure of the corresponding memory cell array, and to route corresponding drive signals to corresponding memory cells, the second circuitry being implemented using solid-state components, each solid state component comprising a network of multilayer structures exhibiting magnetoresistance.

2. The three-dimensional memory of claim 1, wherein the first circuitry of the first level is implemented using solid-state components, each solid state component comprising a network of multilayer structures exhibiting magnetoresistance.

3. The three-dimensional memory of claim 1, wherein each solid state component is configured to generate an output signal which is a function of a resistive imbalance among the multilayer structures and which is proportional to a power current in the network of multilayer structures.

4. The three-dimensional memory of claim 1, wherein the first circuitry of the first level is implemented using CMOS circuitry, the three-dimensional memory further comprising translation circuitry configured to translate logic levels between the first circuitry of the first level and the second circuitry of the memory array levels.

5. The three-dimensional memory of claim 4, wherein a first memory array level is directly adjacent the first level, and wherein the first circuitry includes a plurality of memory cell drivers implemented using CMOS circuitry and configured for driving the memory cells of the first memory array level.

6. The three-dimensional memory of claim 1, wherein each memory cell has a fully-closed flux structure.

7. The three-dimensional memory of claim 1, wherein the address signals generated by the first circuitry address the memory cells of the three-dimensional memory as a two-dimensional array of size $2^n$, where n is an even integer.

8. The three-dimensional memory of claim 1, wherein the memory cell array of each of the memory array levels includes $2^p$ of the memory cells, where p is an even integer.

9. The three-dimensional memory of claim 1, wherein the memory cell array of each of the memory array levels includes $2^m$ memory cell modules, where m is an even integer, each of the memory cell modules including a corresponding portion of the subset of the memory cells of the memory cell array in which the memory cell module is included.

10. The three-dimensional memory of claim 1, wherein a size of the first circuitry is substantially independent of a size of the second circuitry.

11. The three-dimensional memory of claim 1, wherein a configuration of the first logic is independent of a number of the memory array levels.

12. The three-dimensional memory of claim 11, wherein each of the memory array levels includes a plurality of memory cell modules, each of the memory cell modules including a corresponding portion of the subset of the memory cells of the memory array level in which the memory cell module is included, and wherein the configuration of the first logic is independent of a number of memory cell modules in each of the memory array levels.

13. The three-dimensional memory of claim 1, wherein the first circuitry is configured to interface with an external addressing scheme that employs a row address strobe/column address strobe access scheme.

14. The three-dimensional memory of claim 1, wherein the first circuitry is configured to interface with an external addressing scheme that employs a linear chain of numbers access scheme.

15. The three-dimensional memory of claim 1, wherein the second circuitry for each memory array level is configured to apply the drive signals to the corresponding memory cells using a coincident-current architecture.

16. The three-dimensional memory of claim 1, wherein the memory cells of the memory array levels and the second circuitry were fabricated with a single pumpdown.

* * * * *